United States Patent
Wu et al.

(10) Patent No.: US 9,543,886 B2
(45) Date of Patent: Jan. 10, 2017

(54) SHORT CIRCUIT DETECTION CIRCUIT AND SHORT CIRCUIT DETECTION METHOD FOR MULTI-PHASE RECTIFIER AT FREQUENCY DOMAIN

(71) Applicant: ACTRON TECHNOLOGY CORPORATION, Taoyuan (TW)

(72) Inventors: Chi-Kai Wu, Taoyuan (TW); Chia-Sung Yu, Taoyuan (TW); Chih-Chun Lu, Taoyuan (TW)

(73) Assignee: ACTRON TECHNOLOGY CORPORATION, Taoyuan County (TW)

( * ) Notice: Subject to any disclaimer, the term of this patent is extended or adjusted under 35 U.S.C. 154(b) by 390 days.

(21) Appl. No.: 14/297,650

(22) Filed: Jun. 6, 2014

(65) Prior Publication Data
US 2015/0357813 A1 Dec. 10, 2015

(51) Int. Cl.
| | | |
|---|---|---|
| H02H 7/10 | (2006.01) | |
| H02P 29/04 | (2006.01) | |
| G01R 31/02 | (2006.01) | |
| H02P 1/04 | (2006.01) | |
| H02P 9/48 | (2006.01) | |
| G01R 31/40 | (2014.01) | |
| H02P 101/45 | (2015.01) | |

(52) U.S. Cl.
CPC ............ *H02P 29/04* (2013.01); *G01R 31/025* (2013.01); *G01R 31/40* (2013.01); *H02P 1/04* (2013.01); *H02P 9/48* (2013.01); *H02P 29/0243* (2016.02); *H02P 2101/45* (2015.01)

(58) Field of Classification Search
USPC ........................................... 361/18
See application file for complete search history.

(56) References Cited

U.S. PATENT DOCUMENTS

| | | | | |
|---|---|---|---|---|
| 3,622,860 A | * | 11/1971 | Hayek ................. | H02H 1/0015 340/650 |
| 5,771,164 A | * | 6/1998 | Murai ................ | H02M 1/4208 323/222 |
| 6,043,999 A | * | 3/2000 | Ehrenberg ........... | H02J 3/1828 363/125 |
| 2005/0007034 A1 | * | 1/2005 | Kobayashi ............. | H02M 7/06 315/291 |
| 2009/0302678 A1 | * | 12/2009 | Kokubun ............. | H02J 7/1492 307/9.1 |
| 2013/0257301 A1 | * | 10/2013 | Tran ...................... | C01B 13/115 315/200 R |
| 2014/0233284 A1 | * | 8/2014 | Dooley ............... | H02H 7/1252 363/53 |

* cited by examiner

*Primary Examiner* — Ronald W Leja
(74) *Attorney, Agent, or Firm* — Li & Cai Intellectual Property (USA) Office

(57) ABSTRACT

A short circuit detection circuit and a short circuit detection method for a multi-phase rectifier are provided, which are used for detecting conditions of a spectrum of a FWR signal outputted from the multi-phase rectifier in the frequency domain. Next, determining whether the detected signal indicating the amplitude of the frequency of the AC signal is greater than or equal to the reference signal, so as to determine whether the multi-phase rectifier has a short circuit condition. Therefore, the short circuit detection circuit and the short circuit detection method do not have any requirements for configuring a short circuit detection element on each current path of the multi-phase rectifier, so that the power loss and the cost can be reduced effectively.

20 Claims, 4 Drawing Sheets

SHORT CIRCUIT DETECTION CIRCUIT AND SHORT CIRCUIT DETECTION METHOD FOR MULTI-PHASE RECTIFIER AT FREQUENCY DOMAIN

BACKGROUND

1. Technical Field

The present invention relates to a short circuit detection circuit and short circuit detection method, in particular, to a short circuit detection circuit and a short circuit detection method for a multi-phase rectifier at alternator or Integrated Starter Generator (ISG) application.

2. Description of Related Art

A multi-phase rectifier of an alternator or an ISG is composed of many pairs of rectifying elements (e.g., diodes, MOSFETs, IGBTs, and etc.) to convert alternating current (AC) into direct current (DC) and then the direct current charges the battery connected to the multi-phase rectifier. When the multi-phase rectifier becomes short, it generates excessive heat loss causing safety issues (e.g., damaging the whole alternator). The multi-phase rectifier's short circuit detection is necessary to raise the alarm for this abnormal condition. In order to detect the multi-phase rectifier's short circuit, each current path of the multi-phase rectifier will be equipped with a short circuit detection element to detect whether the multi-phase rectifier is short circuit.

Generally speaking, short circuit detection methods for detecting whether a multi-phase rectifier is shorted out use either a sensing resistor or hall-effect sensor. For clarity, the following regards the rectifying element as a diode. For one diode which is configured in a current path, as shown in FIG. 1A, the sensing resistor R1 is configured in serial with the diode D1 so that the current I1 will flow through the diode D1 as well as the sensing resistor R1. Then the operational amplifier (op-amp) OP1 amplifies the voltage across the sensing resistor R1 to generate a detected signal Sd1. Next, the comparator CP1 receives the detected signal Sd1 and compares the detected signal Sd1 with a reference signal Vref1 (i.e., the short circuit threshold voltage) to output a result signal OUT1, so as to determine whether the diode D1 is short. Because the short circuit detection method has to add the additional sensing resistor R1 which is configured in the current path, it will cause ($I1^2$*R1) power loss in the current path. Furthermore, the sensing resistor R1 is required low resistance and high current operation generally and is usually expensive. For complete short circuit detection each multi-phase rectifier must have the above configuration respectively. So that, this will cause more power loss and cost.

Using the other method, as shown in FIG. 1B, the hall-effect sensor HF is configured near a current path of a diode D2 to detect a current I2 of the current path using the magnetic field measurement method and then generate a detected signal Sd2. Next, the comparator CP2 receives the detected signal Sd2 and compares the detected signal Sd2 with a reference signal Vref2 (i.e., the short circuit threshold voltage) to output a result signal OUT2 indicating whether the diode D2 is shorted out. Comparing the short circuit detection method using the hall-effect sensor with that of using the sensing resistor, the short circuit detection method using the hall-effect sensor has less power loss, but the hall-effect sensor HF is also expensive.

Therefore, if the power loss and the cost can be reduced effectively during the processing of the short circuit detection method, the efficiency of the multi-phase rectifier can be enhanced greatly.

To address the above issues, the inventor strives via associated experience and research to present the instant disclosure, which can effectively improve the constraints described above.

SUMMARY

The instant disclosure provides a short circuit detection method/circuit for a three-phase (or more phases other than 3) rectifier at the alternator or the ISG application. For the three-phase rectifier at the alternator, the three-phase rectifier has three bridges connected in parallel. Each bridge has two rectifying elements connected in series. The connecting point between these two rectifying elements of the corresponding bridges is named as PSP (Phase Signal Point). Each PSP is between these two rectifying elements of the corresponding bridges. One rectifying element is connected between the PSP and ground. The other rectifying element is connected between the PSP and an alternator output terminal which is also a full-wave rectifier output terminal.

There are three stator windings in the alternator to generate three alternating current (AC) signals to the corresponding PSP during operation. One end of each stator winding is connected with each other. The other end (i.e., the alternator stator coil's output terminal) of each stator winding is connected to the corresponding PSP terminal. The frequency of each AC signal will keep at the same during one specific rotating period because the frequency of each AC signal can be calculated by the same equation as follows: $\omega = RPM_{alt}$*#pole pairs/60, wherein $\omega$ is the frequency of each AC signal. $RPM_{alt}$ is the operational speed of the alternator. The #pole pairs is the number of pole pairs in an alternator. Therefore, the frequency of each AC signal is same.

The three-phase rectifier receives the three AC signals and rectifies the three AC signals to output a full-wave rectified (FWR) signal including a ripple frequency as a result of AC-to-DC conversion. The method/circuit detects the amplitude of the frequency of the AC signal (i.e., any one of the three AC signals) in the spectrum of the FWR signal. The detection scheme is to convert the FWR signal from time domain to frequency domain to generate the spectrum of the FWR signal and observe the present amplitude of the frequency of the AC signals.

Under the normal operation, the amplitude of the frequency of the AC signal is negligible in the spectrum at the measurement point of FWR signal. However, if there is any occurrence of the short circuit at any of the rectifier elements (i.e., under the abnormal operation), the amplitude of the frequency of the AC signal will be significantly increase. Once this amplitude is greater than a preset reference (e.g., the experimental data based on the different Alternator), it can be concluded the existence of a short circuit condition among one of the rectifier element within the whole bridge set.

Accordingly, the instant disclosure provides a short circuit detection circuit for a multi-phase rectifier. The multi-phase rectifier rectifies AC signals, each of which has a same frequency, to output a FWR signal, as mentioned above. The short circuit detection circuit includes an analyzing unit and a determination unit. The analyzing unit receives the FWR signal and analyzes a spectrum of the FWR signal in the frequency domain based on the same frequency of the AC signals to generate a detected signal indicating an amplitude of the same frequency of the AC signals. The determination unit is electrically connected to the analyzing unit, and compares the detected signal with a reference signal to determine whether the multi-phase rectifier has a short circuit condition.

Specifically, the determination unit receives the detected signal and the reference signal to determine whether the detected signal is greater than or equal to the reference signal. When the determination unit determines that the detected signal is greater than or equal to the reference signal, the spectrum analyzing unit outputs a result signal indicating that a short circuit condition exists among one of the rectifier elements within the bridge configured in the multi-phase rectifier.

The instant disclosure also provides a short circuit detection method for a multi-phase rectifier. The multi-phase rectifier rectifies the received AC signals, each of which has a same frequency, to output a FWR signal as mentioned above. The short circuit detection method is as follows: receiving the FWR signal and analyzing a spectrum of the FWR signal in the frequency domain based on the same frequency of the AC signals to generate a detected signal indicating the amplitude of the same frequency of the AC signals; and receiving the detected signal and a reference signal to determine whether the detected signal is greater than or equal to the reference signal. When the detected signal is greater than or equal to the reference signal, the detection method includes a step of outputting a result signal indicating that a short circuit condition exists among one of the rectifier elements within the bridges configured in the multi-phase rectifier.

In summary, the short circuit detection circuit and the short circuit detection method are used for detecting conditions of the spectrum of the FWR signal outputted from the multi-phase rectifier in the frequency domain, to determines whether the detected signal indicating the amplitude of the frequency of the AC signals is greater than or equal to the reference signal, so as to detect whether the short circuit condition exists among one of the rectifier elements within the bridges configured in the multi-phase rectifier. Therefore, the short circuit detection circuit and the short circuit detection method do not have the requirement of configuring the short circuit detection element (e.g., the sensing resistor or the hall-effect sensor) on each current path, so that the power loss and the cost can be reduced effectively.

In order to further understand the techniques, means and effects of the present invention, the following detailed descriptions and appended drawings are hereby referred to, such that and through which, the purposes, features and aspects of the present disclosure can be thoroughly and concretely appreciated; however, the appended drawings are merely provided for reference and illustration, without any intention to be used for limiting the present invention.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain the principles of the present invention.

DESCRIPTION OF THE EXEMPLARY EMBODIMENTS

Figure 1A:
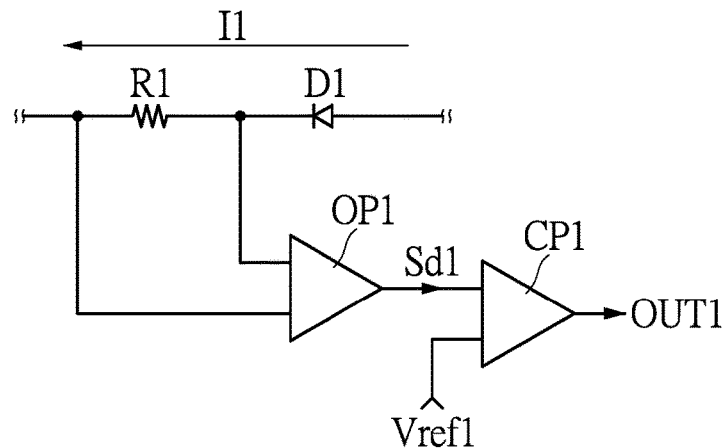
FIG. 1A shows a diagram of a conventional short circuit detection circuit of a current path flowing through a rectifying element.
Figure 1B:
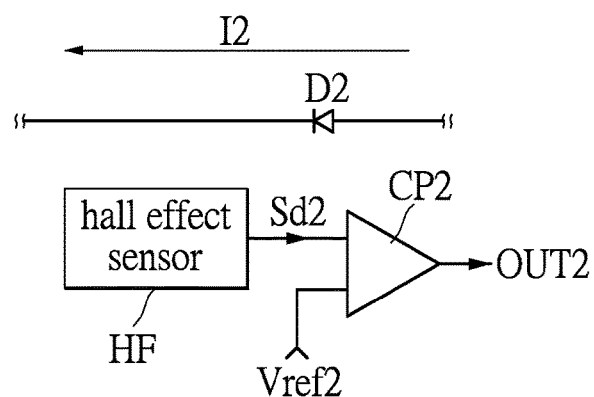
FIG. 1B shows a diagram of another conventional short circuit detection circuit of a current path flowing through a rectifying element.

Reference will now be made in detail to the exemplary embodiments of the present disclosure, examples of which are illustrated in the accompanying drawings. Wherever possible, the same reference numbers are used in the drawings and the description to refer to the same or like parts.

Figure 2A:
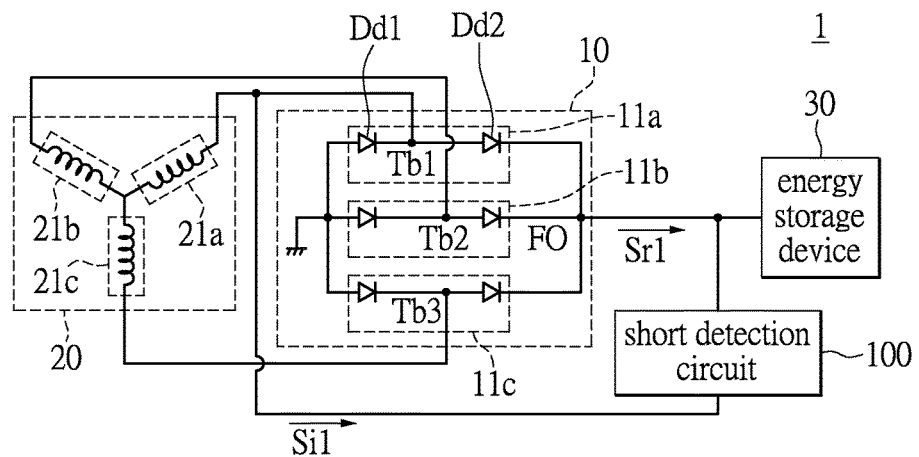
FIG. 2A shows a diagram of a three-phase alternator in accordance with an embodiment of the instant disclosure.

Please refer to FIG. 2A, which shows a diagram of a three-phase alternator in accordance with an embodiment of the instant disclosure. As shown in FIG. 2A, the three-phase alternator 1 has a three-phase rectifier 10, an induction coil 20, an energy storage device 30 (or a load), and a short circuit detection circuit 100. The three-phase rectifier 10 has three bridges connected in parallel, respectively, first bridge 11a, second bridge 11b and third bridge 11c. One end of the first bridge 11a, one end of the second bridge 11b, and one end of the third bridge 11c are grounded. Another end of the first bridge 11a, another end of the second bridge 11b, and another end of the third bridge 11c are connected to a full-wave rectifier output terminal FO. The full-wave rectifier output terminal FO is connected to the energy storage device 30.

More specifically, each bridge 11a, 11b, and 11c has two diodes Dd1 and Dd2 connected in series. For bridges 11a, 11b, and 11c, the anode of the diode Dd1 is grounded, the cathode of the diode Dd1 is connected to the anode of the diode Dd2, and the cathode of the diode Dd2 is connected to the full-wave rectifier output terminal FO. A PSP Tb1 is between the two diodes Dd1 and Dd2 of the bridge 11a, a PSP Tb2 is between the two diodes Dd1 and Dd2 of the bridge 11b, and a PSP Tb3 is between the two diodes Dd1 and Dd2 of the bridge 11c. It shall be noted that the two diodes Dd1 and Dd2 merely serve to illustrate an example of rectifying elements for rectification, and the rectifying elements can also be MOSFETs, IGBTs and etc. The instant disclosure is not limited thereto.

Figure 2B:
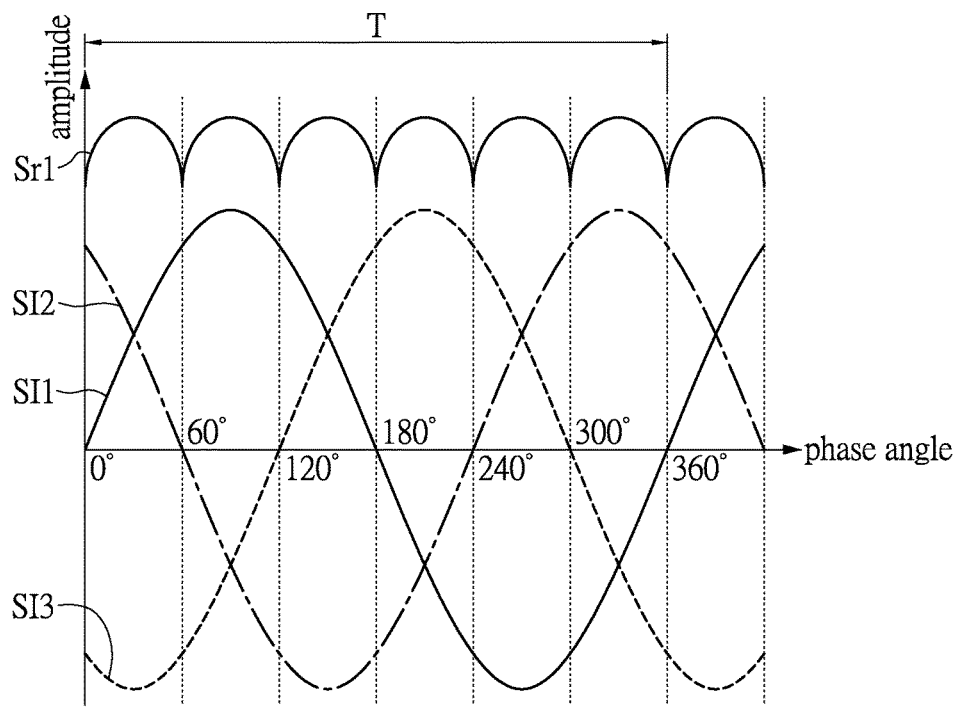
FIG. 2B shows a waveform diagram of a three-phase alternator in accordance with an embodiment of the instant disclosure.

The PSPs Tb1, Tb2, and Tb3 receive the AC signals having the same frequency and then the three-phase rectifier 10 rectifies the AC signals to generate a FWR signal Sr1 to the energy storage device 30. Specifically, as shown in FIG. 2B, the AC signals have three sine wave signals SI1, SI2, and SI3 and the three sine wave signals SI1, SI2, and SI3 have the same frequency. The phase difference among the sine wave signals SI1, SI2, and SI3 is 120 degrees. Then the three-phase rectifier 10 rectifies the sine wave signals SI1, SI2, and SI3 to produce six half-waved ripples in one period T, i.e., the FWR signal Sr1, so that the energy storage device 30 can be charged by the FWR signal Sr1. Moreover, those skilled in the art are able to understand generation of the FWR signal Sr1 through the three-phase rectifier 10, and further descriptions are hereby omitted.

It is worth to note that the frequency of the three sine wave signals SI1, SI2, and SI3 can be calculated by a frequency detector or through other method. For example, the operational speed of the alternator and the number of pole pairs in an alternator (e.q, 18 pole alternator has 9 pole pairs) are known. The frequency of each AC signal can be calculated by the following equation:

$$\omega=RPM_{alt}*\#pole\ pairs/60$$

wherein ω is the frequency of each AC signal, $RPM_{alt}$ is an operational speed of the alternator, and the #pole pairs are the number of pole pairs in the alternator. The instant disclosure is not limited thereto. Similarly, when the frequency of the AC signal and the number of pole pairs in the alternator (e.g., 14 pole alternator has 7 pole pairs) are known, the operational speed of the alternator can also calculated by the aforementioned equation for other applications.

In the instant disclosure, the AC signals are generated by the induction coil 20 and the induction coil 20 can be induced by electromagnetic induction to generate the AC signals. The induction coil 20 has three stator windings displaced 120 degrees from each other, respectively, a first stator winding 21a, a second stator winding 21b, and a third stator winding 21c to form a "Y" configuration. One end of the first stator winding 21a, one end of the second stator winding 21b, and one end of the third stator winding 21c are connected with each other. Another end of the first stator winding 21a is connected to the PSP Tb1 of the bridge 11a. Another end of the second stator winding 21b is connected to the PSP Tb2 of the bridge 11b. Another end of the third stator winding 21c is connected to the PSP Tb3 of the bridge 11c. The induction coil 20 can also be configured to be other windings, such as "delta" configuration or "star" configuration, and the instant disclosure is not limited thereto.

In order to check whether the three-phase rectifier 10 has a short circuit condition existing among one of the rectifier elements within the bridges, the three-phase alternator 1 includes a short circuit detection circuit 100 connected between the three-phase rectifier 10 and the energy storage device 30. The short circuit detection circuit 100 receives the FWR signal Sr1 and an AC signal Si1 to determine whether the three-phase rectifier 10 has the short circuit condition existing among one of the rectifier elements within the bridges.

Figure 2C:
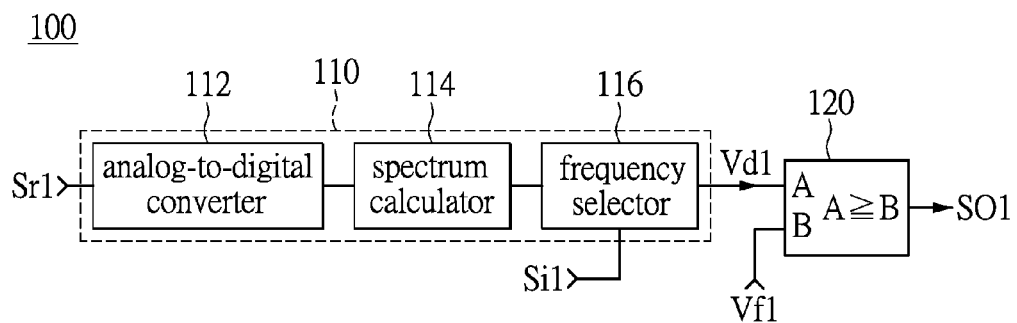
FIG. 2C shows a diagram of a short circuit detection circuit in accordance with an embodiment of the instant disclosure.

As shown in FIG. 2C, the short circuit detection circuit 100 includes a spectrum analyzing unit 110 and a determination unit 120. The spectrum analyzing unit 110 receives the FWR signal Sr1 and analyzes a spectrum of the FWR signal Sr1 in the frequency domain based on the frequency of the AC signal Si1 to generate a detected signal Vd1 indicating the amplitude of the frequency of the AC signal Si1. The determination unit 120 is electrically connected to the spectrum analyzing unit 110. The determination unit 120 receives the detected signal Vd1 and a reference signal Vf1 to determine whether the detected signal Vd1 is greater than or equal to the reference signal Vf1.

When the determination unit 120 determines that the detected signal Vd1 is greater than or equal to the reference signal Vf1, the determination unit 120 outputs a result signal SO1 to indicate that the short circuit condition exists among one of the rectifier elements within the bridges, such as the diode D1 of the bridge 11b is shorted out. This means that when the three-phase rectifier 10 has at least one shorted diode in the bridges 11a~11c, the short circuit detection circuit 100 detects that the amplitude of the frequency of the AC signal Si1 significantly increase in the spectrum of the FWR signal Sr1 in the frequency domain.

When the determination unit 120 determines that the detected signal Vd1 is less than the reference signal Vf1, the determination unit 120 outputs no signal to indicate that the short circuit condition does not exist among one of the rectifier elements within the bridges at present. This means that when the three-phase rectifier 10 does not have any shorted diodes in the bridges 11a~11c, the short circuit detection circuit 100 detects that the amplitude of the frequency of the AC signal Si1 is too small and can be ignored because the amplitude of the frequency of the AC signal Si1 is similar to the noise signal in the spectrum of the FWR signal Sr1.

As shown in FIG. 2C, in the instant disclosure, the spectrum analyzing unit 110 includes an analog-to-digital (AD) converter 112, a spectrum calculator 114, and a frequency selector 116. The AD converter 112 is connected to the spectrum calculator 114. The spectrum calculator 114 is connected to the frequency selector 116. The AD converter 112 receives the FWR signal Sr1 and digitizes the FWR signal Sr1 to generate the digital FWR signal Sr1.

The spectrum calculator 114 calculates the spectrum of the digital FWR signal Sr1 to acquire the spectrum of the digital FWR signal Sr1 having every frequency. The frequency selector 116 selects the frequency of the AC signal Si1 in the spectrum of the FWR signal Sr1 (i.e. selects the specific frequency band in the spectrum of the FWR signal Sr1 based on the AC signal Si1) to output the detected signal Vd1 indicating the amplitude of the frequency of the AC signal Si1.

The determination unit 120 is a digital comparator having an A end and a B end. The A end receives the detected signal Vd1. The B end receives the reference signal Vf1. The digital comparator outputs the result signal SO1 according to the detected signal Vd1 and the reference signal Vf1.

Therefore, when the determination unit 120 outputs the high-level result signal SO1 indicating that the detected signal Vd1 is greater than or equal to the reference signal Vf1, such as 5V, it means that the three-phase rectifier 10 has the short circuit condition existing among one of the rectifier elements within the bridges. When the determination unit 120 outputs no signal (e.g., the low-level result signal SO1 indicating that the detected signal Vd1 is less than the reference signal Vf1, such as 0V), it means that the three-phase rectifier 10 does not have the short circuit condition existing among one of the rectifier elements within the bridges. In the instant disclosure, the determination unit 120, not limited to, but preferably made by the digital comparator, can also use another element to generate the result signal SO1.

Figure 2D:
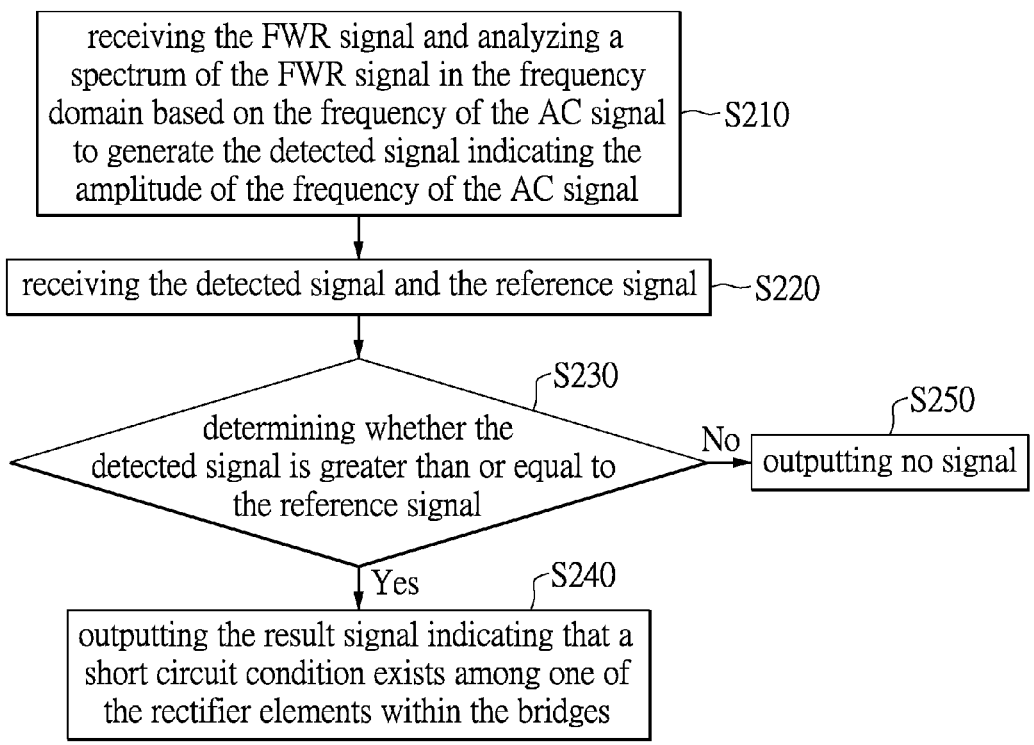
FIG. 2D shows a flowchart of a short circuit detection method in accordance with an embodiment of the instant disclosure.

From the aforementioned exemplary embodiments, the instant disclosure may be generalized as a short circuit detection method, which is adapted for a short circuit detection circuit. Referring to FIG. 2D in conjunction with FIG. 2A~2C, FIG. 2D shows a flowchart of a short circuit detection method in accordance with an embodiment of the instant disclosure. Firstly, the spectrum analyzing unit 110 receives the FWR signal Sr1 and analyzes a spectrum of the FWR signal Sr1 in the frequency domain based on the frequency of the AC signal Si1 to generate the detected signal Vd1 indicating the amplitude of the frequency of the AC signal Si1 (Step S210). Then the determination unit 120 receives the detected signal Vd1 and the reference signal Vf1 to determine whether the detected signal Vd1 is greater than or equal to the reference signal Vf1, so as to analyze the present condition of the rectifier elements within the bridges (Step S220 and S230).

When the determination unit 120 determines that the detected signal Vd1 is greater than or equal to the reference signal Vf1, the three-phase rectifier 10 is in the abnormal operation. The determination unit 120 outputs a result signal SO1 indicating that the short circuit condition exists among one of the rectifier elements within the bridges, which means there is at least one shorted diode in the bridges 11a-11c of the three-phase rectifier 10 (Step S240).

When the determination unit 120 determines that the detected signal Vd1 is less than the reference signal Vf1, the three-phase rectifier 10 is in the normal operation. The determination unit 120 outputs no signal indicating the short circuit condition does not exist among one of the rectifier elements within the bridges, which means there is no shorted diode in the bridges 11a-11c of the three-phase rectifier 10 (Step S250).

Figure 3:
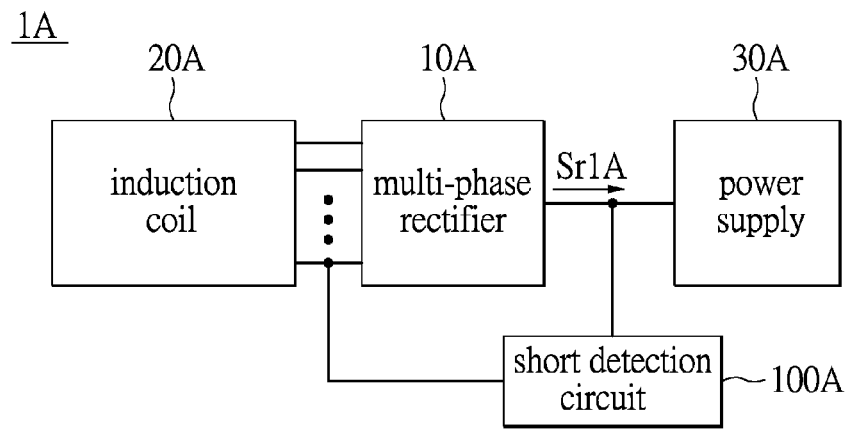
FIG. 3 shows a diagram of a multi-phase alternator in accordance with another embodiment of the instant disclosure.

It is worth noting that, in practice, the short circuit detection circuit 100 can not only be adapted for the three-phase alternator but also be adapted for the multi-phase alternator. The instant embodiment is not limited thereto. Accordingly, as shown in FIG. 3, the multi-phase alternator 1A has a multi-phase rectifier 10A, an induction coil 20A, a power supply 30A, and a short circuit detection circuit 100A. The multi-phase rectifier 10A has N bridges connected in parallel, wherein N is an integer greater than or equal to 2 (e.g., the three bridges 11a-11c in FIG. 2A). Each bridge has two rectifying elements connected in series and a PSP connected between the two rectifying elements of the corresponding bridges (e.g., the diodes Dd1 and Dd2 of the three bridges 11a-11c in FIG. 2A). Each PSP (e.g., the PSPs Tb1-Tb3 in FIG. 2A) receives a AC signal having a same frequency, and the multi-phase rectifier 10A outputs a FWR signal Sr1A to the short circuit detection circuit 100A and the energy storage device 30A (or a load). In the instant disclosure, the rectifying elements can be diode, MOSFET, IGBT and etc. The instant disclosure is not limited thereto.

In addition, the related structures and operation method associated with the multi-phase rectifier 10A, the induction coil 20A, the energy storage device 30A, and the short circuit detection circuit 100A are essentially the same as the three-phase rectifier 10, the induction coil 20, the energy storage device 30, and the short circuit detection circuit 100 described in the aforementioned embodiment, and further descriptions are hereby omitted.

Therefore, when the determination unit of the short circuit detection circuit 100A determines that the detected signal is greater than or equal to the reference signal, the determination unit of the short circuit detection circuit 100A outputs a result signal indicating that a short circuit condition exists among one of the rectifier elements within the bridges.

Similarly, when the determination unit of the short circuit detection circuit 100A determines that the detected signal is less than the reference signal, the determination unit of the short circuit detection circuit 100A outputs a result signal indicating that the short circuit condition does not exist among one of the rectifier elements within the bridges.

Accordingly, the short circuit detection circuit 100A is used for detecting conditions of the spectrum of the FWR signal Sr1A outputted from the multi-phase rectifier 10A in the frequency domain, to determines whether the detected signal indicating the amplitude of the frequency of the AC signal is greater than or equal to the reference signal, so as to detect whether the short circuit condition exists among one of the rectifier elements within the bridges.

Figure 4:
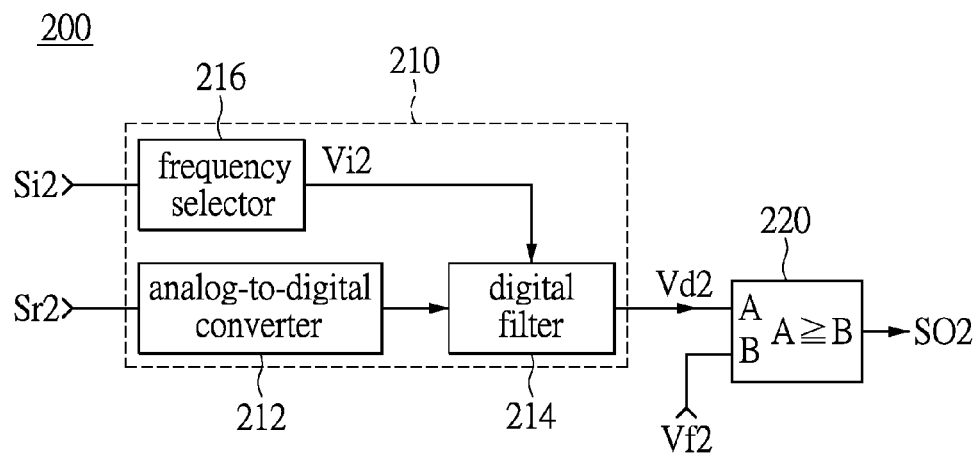
FIG. 4 shows a diagram of a short circuit detection circuit in accordance with another embodiment of the instant disclosure.

As shown in FIG. 4, in another instant disclosure, the short circuit detection circuit 200 receives the FWR signal Sr2 transmitted from a multi-phase rectifier and determines whether the multi-phase rectifier has the shorted rectifying element. The short circuit detection circuit 200 has a spectrum analyzing unit 210 and a determination unit 220 connected to the spectrum analyzing unit 210. The spectrum analyzing unit 210 includes an AD converter 212, a digital filter 214, and a frequency selector 216. The digital filter 214 is connected to the frequency selector 216 and the AD converter 212. The frequency selector 216 generates a select signal Vi2 according to the frequency of the AC signal Si2. For example, the frequency selector 216 generates the select signal Vi2 indicating the frequency of the AC signal Si2. The AD converter 212 receives the FWR signal Sr2 and digitizes the FWR signal Sr2 to generate the digital FWR signal Sr2. The digital filter 214 filters the digital FWR signal Sr2 based on the select signal Vi2 to output the detected signal Vd2 indicating the amplitude of the frequency of the AC signal Si2. The determination unit 220 is a digital comparator having an A end and a B end. The A end receives the detected signal Vd2. The B end receives the reference signal Vf2. The digital comparator outputs the result signal SO2 according to the detected signal Vd2 and the reference signal Vf2.

Therefore, when the determination unit 220 outputs a high-level result signal SO2 indicating that the detected signal Vd2 is greater than or equal to the reference signal Vf2, such as 5V, it means that the multi-phase rectifier has the short circuit condition existing among one of the rectifier elements within the bridges. When the determination unit 220 outputs no signal (alternatively, a low-level result signal SO2 indicating that the detected signal Vd2 is less than the reference signal Vf2, such as 0V), it means that the multi-phase rectifier does not have the short circuit condition existing among one of the rectifier elements within the bridges.

In the instant disclosure, the short circuit detection circuit 200 can also analyze the power or other data of the digital FWR signal Sr2 and the frequency of the AC signal Si2, to determine whether the short circuit condition exists among one of the rectifier elements within the bridges, but the instant embodiment is not limited thereto. The determination unit 220, not limited to, preferably made by the digital comparator, can also include another element to generate the result signal SO2.

Figure 5:
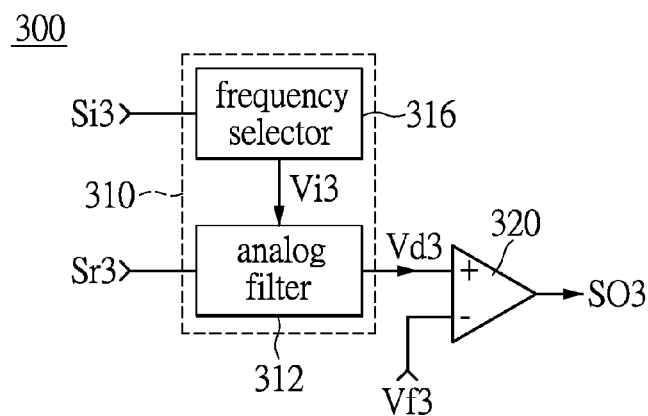
FIG. 5 shows a diagram of a short circuit detection circuit in accordance with another embodiment of the instant disclosure.

As shown in FIG. 5, in another instant disclosure, the short circuit detection circuit 300 receives the FWR signal Sr3 transmitted from the multi-phase rectifier and determines whether the multi-phase rectifier has the shorted rectifying element. The short circuit detection circuit 300 has a spectrum analyzing unit 310 and a determination unit 320 connected to the spectrum analyzing unit 310. The spectrum analyzing unit 310 includes an analog filter 312 and a frequency selector 316 connected to the analog filter 312. The frequency selector 316 generates a select signal Vi3 according to the frequency of the AC signal Si3. For example, the frequency selector 316 generates the select signal Vi3 indicating the frequency of the AC signal Si3. The analog filter 312 receives the FWR signal Sr3 and the select signal Vi3 to filter the FWR signal Sr3 based on the select signal Vi3 to output the detected signal Vd3 indicating the amplitude of the frequency of the AC signal Si3 to the determination unit 320.

The determination unit 320 may be an operational amplifier (op-amp) 320 having a non-inverting end, an inverting end, and an output end, wherein the non-inverting end receives the detected signal Vd3, the inverting end receives a reference signal Vf3, and the output end outputs the result signal SO3 according to the detected signal Vd3 and the reference signal Vf3, wherein the reference signal Vf3 is defined by the amplitude of the frequency of the AC signal Si3.

Therefore, when the output end of the op-amp 320 outputs a high-level result signal SO3 indicating that the detected signal Vd3 is greater than or equal to the reference signal Vf3, such as 5V, it means that the multi-phase rectifier has the short circuit condition existing among one of the rectifier elements within the bridges. When the determination unit 320 outputs no signal (alternatively, a low-level result signal SO3 indicating that the detected signal Vd3 is less than the reference signal Vf3, such as 0V), it means that the multi-phase rectifier does not have the short circuit condition existing among one of the rectifier elements within the bridges.

In the instant disclosure, the short circuit detection circuit 300 can also analyze the power or other data of the digital FWR signal Sr3 and the frequency of the AC signal Si3, to determine whether the short circuit condition exists among one of the rectifier elements within the bridges, but the instant embodiment is not limited thereto. Besides, the determination unit 320, not limited to, preferably made by the op-amp, can also include another element to generate the result signal SO3.

In summary, the short circuit detection circuit and the short circuit detection method provided in the present invention are used for detecting conditions of the spectrum of the FWR signal outputted from the multi-phase rectifier in the frequency domain, and then determining whether the detected signal indicating the amplitude of the frequency of the AC signals is greater than or equal to the reference signal, so as to determine whether the short circuit condition exists among one of the rectifier elements within the bridges configured in the multi-phase rectifier. Therefore, the short circuit detection circuit and the short circuit detection method provided in the present invention do not have any requirements for configuring a short circuit detection element (e.g., the sensing resistor or the hall-effect sensor) on each current path for the conventional short circuit detection method, so that the power loss and the cost can be reduced effectively.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A short circuit detection circuit for a multi-phase rectifier, the multi-phase rectifier having a plurality of bridges connected in parallel, each bridge having two rectifying elements connected in series and a phase signal point (PSP) configured between the two rectifying elements, each PSP receiving an alternating current (AC) signal, each AC signal having a same frequency, the multi-phase rectifier rectifying the AC signals to output a full-wave rectified (FWR) signal, and the short circuit detection circuit comprising:
   a spectrum analyzing unit, receiving the FWR signal and analyzing a spectrum of the FWR signal in the frequency domain based on the same frequency of the AC signals to generate a detected signal indicating an amplitude of the same frequency of the AC signals; and
   a determination unit, electrically connected to the spectrum analyzing unit and receiving the detected signal and a reference signal to determine whether the detected signal is greater than or equal to the reference signal;
   wherein when the determination unit determines that the detected signal is greater than or equal to the reference signal, the determination unit outputs a result signal indicating that a short circuit condition exists among one of the rectifying elements within the bridges.

2. The short circuit detection circuit according to claim 1, wherein when the determination unit determines that the detected signal is less than the reference signal, the determination unit outputs no signal.

3. The short circuit detection circuit according to claim 1, wherein the spectrum analyzing unit comprises:
   an analog-to-digital (AD) converter, receiving the FWR signal and digitizing the FWR signal to generate a digital FWR signal;
   a spectrum calculator, electrically connected to the AD converter and calculating the spectrum of the digital FWR signal in the frequency domain; and
   a frequency selector, electrically connected to the spectrum calculator and selecting the same frequency of the AC signals in the spectrum of the FWR signal to output the detected signal.

4. The short circuit detection circuit according to claim 3, wherein the frequency selector selects the same frequency of the AC signals in the spectrum of the FWR signal according to one of the AC signals.

5. The short circuit detection circuit according to claim 1, wherein the spectrum analyzing unit comprises:
   a frequency selector, generating a select signal indicating the same frequency of the AC signals according to one of the AC signals;
   an AD converter, receiving the FWR signal and digitizing the FWR signal to generate a digital FWR signal; and
   a digital filter, electrically connected to the frequency selector and the AD converter, filtering the digital FWR signal based on the select signal to output the detected signal.

6. The short circuit detection circuit according to claim 1, wherein the spectrum analyzing unit comprises:
   a frequency selector, generating a select signal indicating the same frequency of the AC signals according to one of the AC signals; and
   an analog filter, electrically connected to the frequency selector, receiving the FWR signal and the select signal, and filtering the FWR signal based on the select signal to output the detected signal.

7. The short circuit detection circuit according to claim 6, wherein the determination unit is an operational amplifier (op-amp) having a non-inverting end, an inverting end, and an output end, wherein the non-inverting end receives the detected signal, the inverting end receives the reference signal, and the output end outputs the result signal according to the detected signal and the reference signal.

8. The short circuit detection circuit according to claim 1, wherein the multi-phase rectifier includes a three-phase rectifier, the three-phase rectifier has three bridges connected in parallel, each bridge has two rectifying elements connected in series and the PSP is configured between the two rectifying elements, each PSP receives the AC signal having the same frequency, and the three-phase rectifier rectifies the AC signals to output the FWR signal.

9. The short circuit detection circuit according to claim 8, wherein the AC signals are generated by a first stator winding, a second stator winding, and a third stator winding, respectively, wherein one end of the first stator winding, one end of the second stator winding, and one end of the third stator winding are electrically connected with each other, and another end of the first stator winding, another end of the second stator winding, and another end of the third stator winding are respectively connected to the PSP of the corresponding bridges.

10. The short circuit detection circuit according to claim 1, wherein the short circuit detection circuit is configured in one of an alternator and an integrated starter generator (ISG), and the same frequency of the AC signals is calculated by an equation:

$$\omega = RPM_{alt} * \#pole\ pairs/60$$

wherein $\omega$ is the same frequency of the AC signals, $RPM_{alt}$ is an operational speed of the alternator or the ISG, and #pole pairs is a number of pole pairs in the alternator or the ISG.

11. A short circuit detection method for a multi-phase rectifier rectifying AC signals to output a full-wave rectified (FWR) signal, the short circuit detection method comprising:
receiving the FWR signal and analyzing a spectrum of the FWR signal in a frequency domain based on a same frequency of the AC signals to generate a detected signal indicating an amplitude of the same frequency of the AC signals; and
receiving the detected signal and a reference signal to determine whether the detected signal is greater than or equal to the reference signal;
wherein when the detected signal is greater than or equal to the reference signal, outputting a result signal indicating that a short circuit condition exists in the multi-phase rectifier.

12. The short circuit detection method according to claim 11, wherein when the detected signal is less than the reference signal, no signal is outputted.

13. The short circuit detection method according to claim 11, wherein the step after receiving the FWR signal, further comprises:
digitizing the FWR signal to generate a digital FWR signal;
calculating the spectrum of the digital FWR signal in the frequency domain; and
selecting the same frequency of the AC signals in the spectrum of the FWR signal to output the detected signal.

14. The short circuit detection method according to claim 13, wherein the same frequency of the AC signals in the spectrum of the FWR signal is selected according to one of the AC signals.

15. The short circuit detection method according to claim 11, wherein the step after receiving the FWR signal, further comprises:
generating a select signal according to one of the AC signals;
digitalizing the FWR signal to generate a digital FWR signal; and
filtering the digital FWR signal based on the select signal to output the detected signal.

16. The short circuit detection method according to claim 11, wherein the step after receiving the FWR signal, further comprises:
generating a select signal according to one of the AC signals;
filtering the FWR signal based on the select signal to output the detected signal.

17. The short circuit detection method according to claim 11, wherein the multi-phase rectifier includes a three-phase rectifier receiving and rectifying three AC signals, each AC signal has the same frequency, the three-phase rectifier has three bridges connected in parallel, each bridge has two rectifying elements connected in series and a phase signal point (PSP) configured between the two rectifying elements, and each PSP receives one of the three AC signals.

18. The short circuit detection method according to claim 17, wherein the AC signals are generated by a first stator winding, a second stator winding, and a third stator winding, respectively, wherein one end of the first stator winding, one end of the second stator winding, and one end of the third stator winding are electrically connected with each other, and another end of the first stator winding, another end of the second stator winding, and another end of the third stator winding are respectively connected to the PSP of the corresponding bridges.

19. A short circuit detection circuit for a multi-phase rectifier rectifying AC signals to output a full-wave rectified (FWR) signal, the short circuit detection circuit comprising:
an analyzing unit, receiving the FWR signal and analyzing a spectrum of the FWR signal in the frequency domain based on a same frequency of the AC signals to generate a detected signal indicating an amplitude of the same frequency of the AC signals; and
a determination unit, electrically connected to the analyzing unit and comparing the detected signal with a reference signal to determine whether the multi-phase rectifier has a short circuit condition.

20. The short circuit detection circuit according to claim 19, wherein when the determination unit determines that the detected signal is greater than or equal to the reference signal, the determination unit outputs a result signal indicating that the multi-phase rectifier has a short circuit condition, and when the determination unit determines that the detected signal is less than the reference signal, the determination unit outputs no signal.

* * * * *